United States Patent [19]
Seligson

[11] Patent Number: 5,376,935
[45] Date of Patent: Dec. 27, 1994

[54] DIGITAL-TO-ANALOG AND ANALOG-TO-DIGITAL CONVERTERS USING ELECTRICALLY PROGRAMMABLE FLOATING GATE TRANSISTORS

[75] Inventor: Daniel A. Seligson, Palo Alto, Calif.

[73] Assignee: Intel Corporation, Santa Clara, Calif.

[21] Appl. No.: 39,847

[22] Filed: Mar. 30, 1993

[51] Int. Cl.$^5$ .................. H03M 1/12; H03M 1/66
[52] U.S. Cl. ..................... 341/136; 341/133
[58] Field of Search .................. 341/133, 136

[56] References Cited

U.S. PATENT DOCUMENTS

| | | | |
|---|---|---|---|
| 4,146,882 | 3/1979 | Hoff, Jr. et al. | 341/138 |
| 4,293,848 | 10/1981 | Cheng et al. | 341/136 |
| 4,398,207 | 8/1983 | Hoff, Jr. et al. | 257/379 |
| 5,331,323 | 7/1994 | Yamamoto | 341/136 |

FOREIGN PATENT DOCUMENTS 0349775 10/1990 European Pat. Off. .

OTHER PUBLICATIONS

-A. Silburt, A. Boothroyd, and M. Elmasry, "A Novel Multiple Threshold MOSFET Structure for A/D and D/A Conversion," IEEE Journal of Solid-State Circuits, vol. SC-19, No. 5, pp. 794-801 (Oct. 1984).
-R. Walden, S. Schmitz, A. Kramer, L. Larson, and J. Pasiecznik, "A Deep-Submicrometer Analog-to-Digital Converter using Focused-Ion-Beam Implants," IEEE Journal of Solid-State Circuits, vol. 25, No. 2, pp. 562-570 (Apr. 1990).

*Primary Examiner*—Howard L. Williams
*Attorney, Agent, or Firm*—Blakely, Sokoloff, Taylor & Zafman

[57] ABSTRACT

A digital-to-analog converter includes a plurality of electrically programmable floating gate transistors, each having a electrically programmable threshold voltage. Each of the transistors has its source coupled to ground, its control gate coupled to an output node, and its drain coupled to the output node via one of a plurality of switching circuits. The output node is coupled to a voltage source via a load circuit. An input circuit decodes a digital input signal to selectively generate one of a plurality of control signals at a time in accordance with the digital input signal. Each of the control signals is for one of the switching circuits. When a transistor is coupled to the output node, the voltage level of the output node is equal to the threshold voltage of that transistor. An analog-to-digital converter includes a plurality of electrically programmable floating gate transistors, each having a electrically programmable threshold voltage. Each of the transistors has its source coupled to ground, its control gate coupled to an input analog voltage, and its drain coupled one of a plurality of output nodes. Each of the output nodes is coupled to the voltage source via its respective load circuit. The output circuit generates a digital output signal in accordance with the number of the transistors that are caused to be conducting by the input analog voltage.

12 Claims, 4 Drawing Sheets

FIG_3

FIG. 4

FIG_5

DIGITAL-TO-ANALOG AND ANALOG-TO-DIGITAL CONVERTERS USING ELECTRICALLY PROGRAMMABLE FLOATING GATE TRANSISTORS

FIELD OF THE INVENTION

The present invention pertains to the field of analog-to-digital and digital-to-analog converters. More particularly, this invention relates to analog-to-digital and digital-to-analog converters using electrically programmable floating gate transistors.

BACKGROUND OF THE INVENTION

Prior n-bit digital-to-analog (D/A) or analog-to-digital (A/D) converters typically employ a so-called voltage ladder having $2^n$ equally spaced taps. Each of these $2^n$ taps is used as input to one of $2^n$ dual-input voltage comparators. The second input of each of the $2^n$ comparators is a voltage determined by the input of the converter. One prior method of constructing the voltage ladder in integrated circuits is to use a high resistivity film, tapped at such points along its length as to provide the requisite voltages.

One prior problem of the prior resistive voltages ladders is that the procedures for depositing and etching the high resistivity films are not common to most MOS fabrication processes. Thus it is typically expensive to introduce A/D or D/A converters into circuits fabricated on most MOS process lines. Also, even when available, these resistive ladders are typically physically large and thus expensive to fabricate.

Another prior method of constructing the voltage ladder is to use an array of metal-oxide-semiconductor (MOS) transistors, each transistor of the array having a different threshold voltage corresponding to one of the desired voltages of the voltage ladder. The threshold voltage of each of the MOS transistors in a D/A converter is approximately equivalent to one of the analog voltages to which a digital signal can be converted. The input digital signal selects the associative one of the MOS transistors of the D/A converter to conduct, thereby forming an analog voltage output which is equivalent to the threshold voltage of the selected MOS transistor. Each of the MOS transistors in an A/D converter acts as a comparator to compare an input analog voltage with its threshold voltage. When the input analog voltage is applied to the gate of each of the MOS transistors of the A/D converter, those transistors having threshold voltages less than the input analog voltage are turned on while those transistors having threshold voltages greater than the input analog voltage are turned off.

The unique threshold voltage in each of the MOS transistors is typically set by semiconductor processing. As is known, the threshold voltage of a MOS transistor is determined during fabrication by the semiconductor processing. Various prior art ways are known that can process the MOS transistors to different threshold voltages.

One prior problem of the prior MOS voltage ladders is the high cost of fabricating transistors having $2^n$ different threshold voltages. Typically this would require many additional photomasking steps, or specialized focused ion beam implanters. Historically, these costs have made it impractical to use such methods except for research purposes. Moreover, once the D/A or A/D converter having the MOS transistors is fabricated on a silicon substrate, the threshold voltages of these MOS transistors are irreversibly determined and cannot be altered. Frequently, a change in circuit design or application requirements may require a change in the conversion range of a prior D/A or A/D converter in the circuit.

Another disadvantage is that the formation of the unique threshold voltage for each of the MOS transistors by the semiconductor processing is typically very difficult and costly. First, because of the process variation, it is typically very difficult to make the threshold voltage accurately. Second, the semiconductor processing to set the unique threshold voltage in each of the MOS transistors is typically very complicated and typically cannot be used during mass production.

SUMMARY AND OBJECTS OF THE INVENTION

One object of the present invention is to provide electrically programmable analog-to-digital and digital-to-analog converters.

Another object of the present invention is to provide electrically erasable and electrically programmable analog-to-digital and digital-to-analog converters.

Another object of the present invention is to provide electrically programmable analog-to-digital and digital-to-analog converters, wherein the threshold voltage of each comparison transistor in each of the converters is electrically programmable.

Another object of the present invention is to provide electrically programmable analog-to-digital and digital-to-analog converters, wherein the voltage ladder does not need to be equally spaced apart, thus allowing the conversion levels to be arbitrary.

A further object of the present invention is to provide electrically programmable analog-to-digital and digital-to-analog converters, wherein the threshold voltage of each comparison transistor in each of the converters is electrically erasable and electrically programmable.

A digital-to-analog converter includes a first and a second electrically programmable floating gate transistor, each having a drain, a source, a control gate, and a floating gate. The first and second transistors have a first and a second electrically programmable threshold voltage, respectively. The control gate of the first and second transistors is coupled to an output node. The output node is coupled to a first voltage source via a load circuit. The source of the first and second transistors is coupled to a second voltage source. A circuit is coupled to receive a digital input signal for selectively coupling the drain of one of the first and second transistors to the output node in response to the digital signal. When the drain of the first transistor is coupled to the output node, the output node is set at the first programmable threshold voltage. When the drain of the second transistor is coupled to the output node, the output node is set at the second programmable threshold voltage. Thus the digital input signal is converted into an analog voltage.

An analog-to-digital converter includes a first and a second electrically programmable floating gate transistor, each having a drain, a source, a control gate, and a floating gate. The first transistor has a first electrically programmable threshold voltage and the second transistor has a second electrically programmable threshold voltage. The drain of the first transistor is coupled to a first output node. The drain of the second transistor is coupled to a second output node. The first output node is coupled to a first voltage source via a first load circuit. The second output node is coupled to the first voltage source via a second load circuit. The source of the first and second transistors is coupled to a second voltage source. The control gate of the first and second transistors is coupled to receive an input analog voltage. When the input analog voltage is greater than or equal to the first programmable threshold voltage, the first transistor is conducting and the first output node generates a first signal. When the input analog voltage is greater than or equal to the second programmable threshold voltage, the second transistor is conducting and the second output node generates a second signal. An output circuit is coupled to the first and second output nodes for encoding the first and second signals into a digital output signal such that the input analog voltage is convened into the digital output signal.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which:

FIG. 1 is a cross-sectional view of an electrically erasable and electrically programmable floating gate transistor;

DETAILED DESCRIPTION

An analog-to-digital ("A/D") converter employing electrically erasable and electrically programmable floating gate transistors is described. The A/D converter is used for receiving an analog signal and for providing an output digital signal.

An digital-to-analog ("D/A") converter employing electrically erasable and electrically programmable floating gate transistors is also described. The D/A converter is used for receiving a digital signal and for providing an output analog signal.

FIG. 1 shows a prior art electrically erasable and electrically programmable floating gate transistor 9 that is used in the D/A and A/D converters in one embodiment of the present invention. FIG. 1 also shows the symbolic representation of floating gate transistor 9. Floating gate transistor 9 is formed on a silicon substrate 15. Transistor 9 is shown in a partially fabricated state because this best reveals its structure.

Floating gate transistor 9 includes a pair of spatially separated doped regions disposed in substrate 15— namely, a drain region 12 and a source region 13. A polysilicon floating gate 10 is generally disposed above and between these regions and insulated from these regions by a silicon dioxide insulating layer 14. Floating gate 10 is completely surrounded by insulating layers and hence, electrically floats. A second gate (control gate) 11 is disposed above floating gate 10. In one embodiment, this gate is fabricated from a second layer of polysilicon.

Floating gate transistor 9 uses asymmetrically doped source and drain regions. The source and drain regions 13 and 12 are both doped with an arsenic dopant and source region 13 is additionally doped with a phosphorous dopant. Hence, source region 13 is more deeply doped. In addition, source region 13 overlaps the overlying floating gate 10.

Floating gate transistor 9 of FIG. 1 may be fabricated using well-known MOS technology.

Figures 1A, 1B, 2:
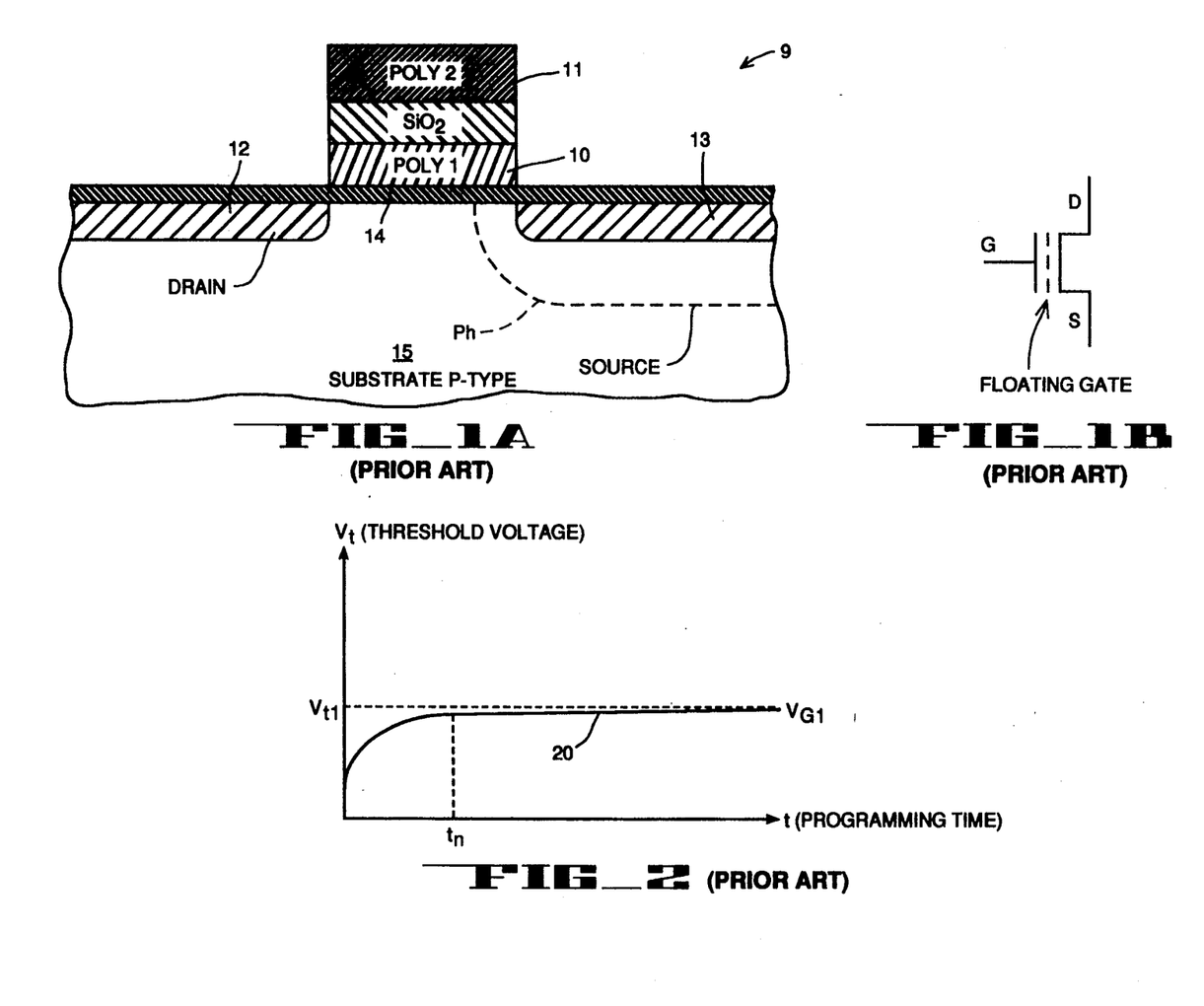
FIG. 2 is a voltage-time diagram, illustrating the threshold voltage of the floating gate transistor of FIG. 1 with respect to the programming time and the programming gate voltage.

After fabrication, transistor 9 has a threshold voltage of approximately zero volts. The threshold of transistor 9 can be electrically programmed (i.e., negatively charging the floating gate) by coupling control gate 11 to a positive potential, drain region 12 to a potential of approximately +7 volts, and source region 13 to ground. Under these conditions, channel hot electron injection occurs through oxide layer 14. As is known, the threshold voltage of transistor 9 can be programmed to different voltage levels by applying different programming potentials to control gate 11 of transistor 9. This will be described below, in conjunction with FIG. 2.

The programmed threshold voltage of transistor 9 can also be electrically erased. To erase the programmed threshold voltage of transistor 9, drain region 12 is floated, control gate 11 is grounded and a potential of approximately +12 volts is applied to source region 13. Under these conditions, charge tunnels from floating gate 10 to source region 13.

Referring to FIG. 2, the relationship of the threshold voltage of floating gate transistor 9 of FIG. 1 with respect to the programming voltage applied at the control gate of the transistor and the programming time is shown. As can be seen from FIG. 2, after sufficient programming time, the threshold voltage of floating gate transistor 9 becomes saturated to approach a target voltage level determined by the programming gate voltage $V_G$ applied at the control gate of the transistor. When the programming gate voltage is $V_{G1}$ voltage, the threshold voltage of the transistor is saturated to approach $V_{t1}$ voltage (curve 20). Therefore, the voltage level of the programmed threshold voltage of floating gate transistor 9 can be controlled by controlling the programming gate voltage $V_G$ applied at the control gate of the floating gate transistor.

Moreover, the desired programmed threshold voltage $V_t$ of a floating gate transistor can be achieved by selecting an appropriate combination of the programming gate voltage $V_G$ and the programming time.

Figure 3:
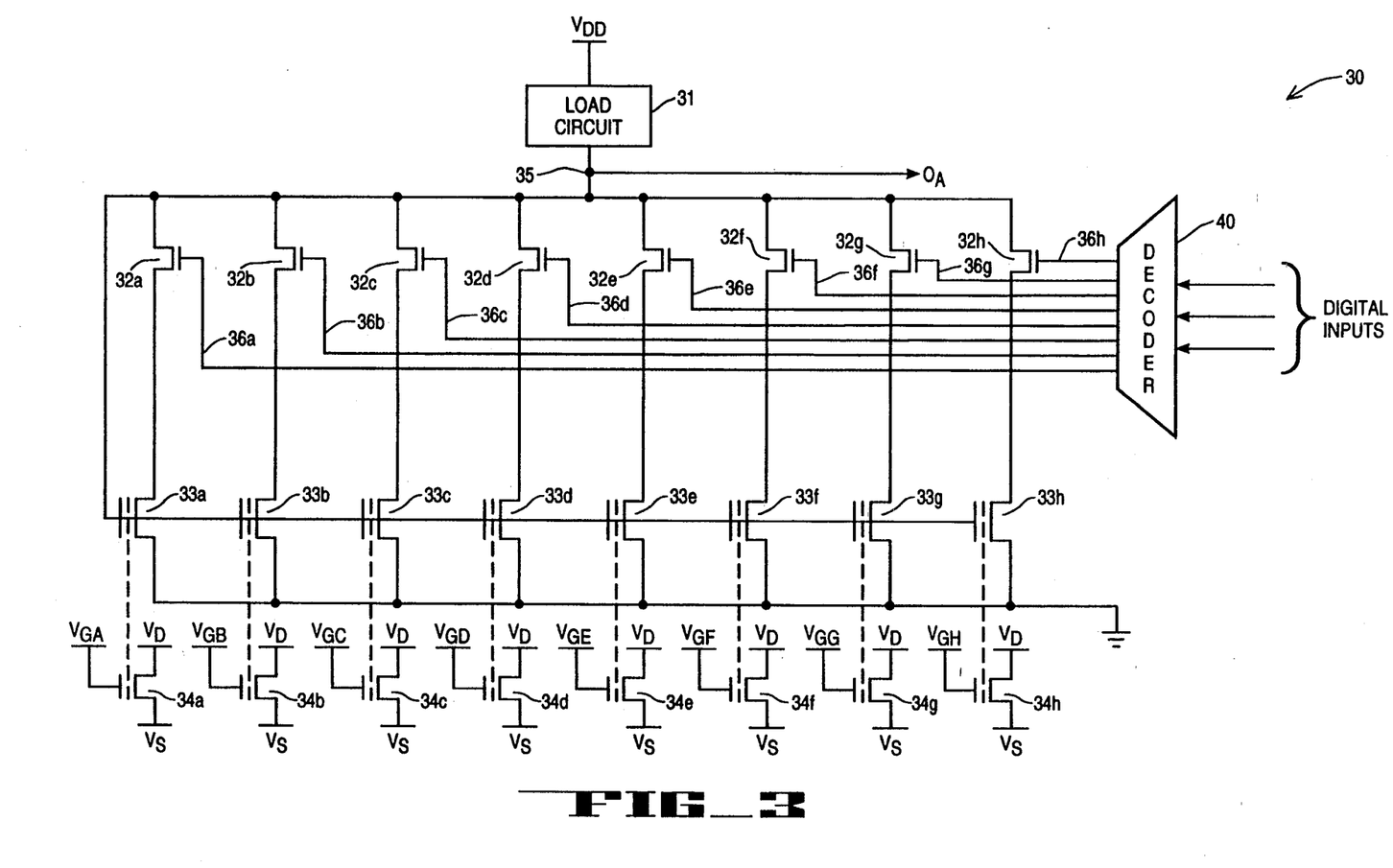
FIG. 3 is a circuitry diagram of a digital-to-analog converter that includes a plurality of electrically erasable and electrically programmable floating gate transistors.

FIG. 3 illustrates in circuitry diagram form a D/A converter 30 that implements an embodiment of the present invention. In FIG. 3, D/A converter 30 is an eight conversion level (i.e., 3 bit) D/A converter. For alternative embodiments, D/A converter 30 can have more or fewer than eight conversion levels. For example, D/A converter 30 can have four conversion levels. For an n-bit digital input, $2^n$ floating gate transistors are required.

D/A converter 30 includes eight electrically erasable and electrically programmable floating gate transistors 33a through 33h, for one embodiment. For this embodiment, each of floating gate transistors 33a–33h corresponds to one of the eight conversion levels. When D/A converter 30 have four conversion levels, D/A converter 30 has four floating gate transistors.

The source of each of floating gate transistors 33a–33h is connected to ground. The control gate of each of transistors 33a–33h is connected to an output node 35. The drain of each of transistors 33a–33h is connected to output node 35 via one of eight switching transistors 32a through 32h, respectively. Output node 35 is also connected to a voltage supply $V_{DD}$ via a load circuit 31. Output node 35 provides an analog voltage output $O_A$ to external circuitry (not shown).

For an alternative embodiment, each of transistors 33a–33h is an electrically programmable floating gate transistor.

For one embodiment, load circuit 31 includes a resistor. For another embodiment, load circuit 31 includes a constant-on load transistor.

The gate of each of switching transistors 32a through 32h is connected to a decoder 40 via one of eight lines 36a through 36h, respectively. Decoder 40 receives a three bit input digital signal and selectively turns on one of switching transistors 32a through 32h in accordance with the input digital signal. For example, when the input digital signal is "111," decoder 40 turns on switching transistor 32h. When the input digital signal is "000," decoder 40 turns on switching transistor 32a.

Each of floating gate transistors 33a–33h has a threshold voltage. As described above, the threshold voltage of a floating gate transistor can be programmed to various voltages. In addition, the programmable threshold voltage of the floating gate transistor can be erased electrically. Therefore, the threshold voltage of each of transistors 33a–33h can be electrically programmed to various voltages and can be electrically erased. The programmable threshold voltage of each of floating gate transistors 33a–33h is equal to one of the output analog voltages to which the input digital signal is converted. For example, floating gate transistor 33a has a programmable threshold voltage that is corresponding to the digital signal "000" and floating gate transistor 33h has a programmable threshold voltage that is corresponding to the digital signal "111."

During operation, decoder 40 receives the three-bit input digital signal. Decoder 40 then turns on one of switching transistors 32a–32h to couple the drain of the associated one of floating gate transistors 33a–33h to output node 35. For example, when the input digital signal is "011," decoder 40 turns on switching transistor 33c, which connects the drain of floating gate transistor 33c to output node 35. Floating gate transistor 33c then self-biases itself to its toggle point level determined by the threshold voltage of transistor 33c. As a result, output node 35 supplies an output analog voltage $O_A$ which is equal to the threshold voltage of transistor 33c. This thus converts the input digital signal applied to decoder 40 into the equivalent analog voltage which is the threshold voltage of floating gate transistor 33c. As described above, the threshold voltage of each of floating gate transistors 33a–33h is equal to one of the analog voltages to which the input digital signal is converted.

When, for example, the input digital signal received by decoder 40 is "110," decoder 40 then causes switching transistor 32g to connect the drain of floating gate transistor 33g to output node 35. This in turn causes the voltage of output node 35 to be equal to the threshold voltage of floating gate transistor 33g.

D/A converter 30 also includes eight electrically erasable and electrically programmable floating gate transistors 34a through 34h, each for programming and erasing one of floating gate transistors 33a–33h. Each of floating gate transistors 34a–34h has its floating gate connected to the floating gate of its associated one of floating gate transistors 33a–33h. For example, floating gate transistor 34a has its floating gate connected to the floating gate of transistor 33a and floating gate transistor 34h has its floating gate connected to the floating gate of transistor 33h. The threshold voltage of each of floating gate transistors 33a–33h is programmed by programming its associated one of floating gate transistors 34a–34h. When one of transistors 34a–34h is programmed to have a threshold voltage, the respective associated one of transistors 33a–33h will have the same threshold voltage. For example, if transistor 34a is programmed with a threshold voltage, transistor 33a will have the same threshold voltage as transistor 34a. The threshold voltage of each of floating gate transistors 33a–33h can also be erased by erasing its associated one of floating gate transistors 34a–34h.

The programming of each of floating gate transistors 34a–34h is achieved by applying programming voltage pulses to the control gate and drain of each of transistors 34a–34h. The programming voltage pulses have fixed magnitude and variable pulse durations. During programming, the programming voltage pulses are repeatedly applied until the transistor under programming has the desired threshold voltage. The threshold of the transistor under programming is also measured between the programming voltage pulses to determine when the threshold voltage reaches the desired voltage level.

For example, when floating gate transistor 33a is required to be programmed to $V_{T1}$ threshold voltage, the drain voltage $V_D$ of transistor 34a receives programming drain voltage pulses of approximately 7 volts and the source of transistor 34a is grounded. The control gate of transistor 34a receives programming control gate voltage pulses of $V_{GA}$ voltage. The voltage level of the $V_{GA}$ voltage for transistor 34a can be set such that transistor 34a can be programmed to have the $V_{T1}$ threshold voltage. For example, when a programming gate voltage of 4 volts can cause the transistor for programming to have a threshold voltage of 1 volt and the $V_{T1}$ threshold voltage is required to be 1 volt, the $V_{GA}$ voltage applied at the control gate of transistor 34a is set to be 4 volts. When the $V_{T1}$ threshold voltage is required to be 2 volts and a programming gate voltage of 5 volts can cause the transistor for programming to have a threshold voltage of 2 volts, the $V_{GA}$ voltage applied at the control gate of transistor 34a is set to be 5 volts.

As described above, the control gate of each of transistors 34a–34h is connected to the floating gate of the associated one of floating gate transistors 33a–33h. Therefore, when electrical charges are building up in the floating gate of transistor 34a during programming, the charges also move to the floating gate of transistor 33a. As a result, the threshold voltage of transistor 33a becomes $V_{T1}$ when transistor 34a is programmed to have the $V_{T1}$ threshold voltage.

The threshold voltage of each of transistors 33a–33h can also be electrically erased by erasing the associated one of transistors 34a–34h. This is done by applying erasure voltage pulses of approximately 12 volts to the source of the associated transistor. For example, when the threshold voltage of transistor 33a needs to be erased, the erasure voltage pulses are applied to the source of transistor 34a, which cause charge stored in the floating gate of transistors 33a and 34a to be tunneled to the source of transistor 34a.

For an alternative embodiment, D/A converter 30 does not include transistors 34a–34h. Instead, each of transistors 33a–33h receives the programming voltage pulses directly. For this embodiment, each of transistors 33a–33h directly receives its programming voltage pulses during programming and erasure voltage pulses during erasure via a switching circuit (not shows in FIG. 3).

Figure 4:
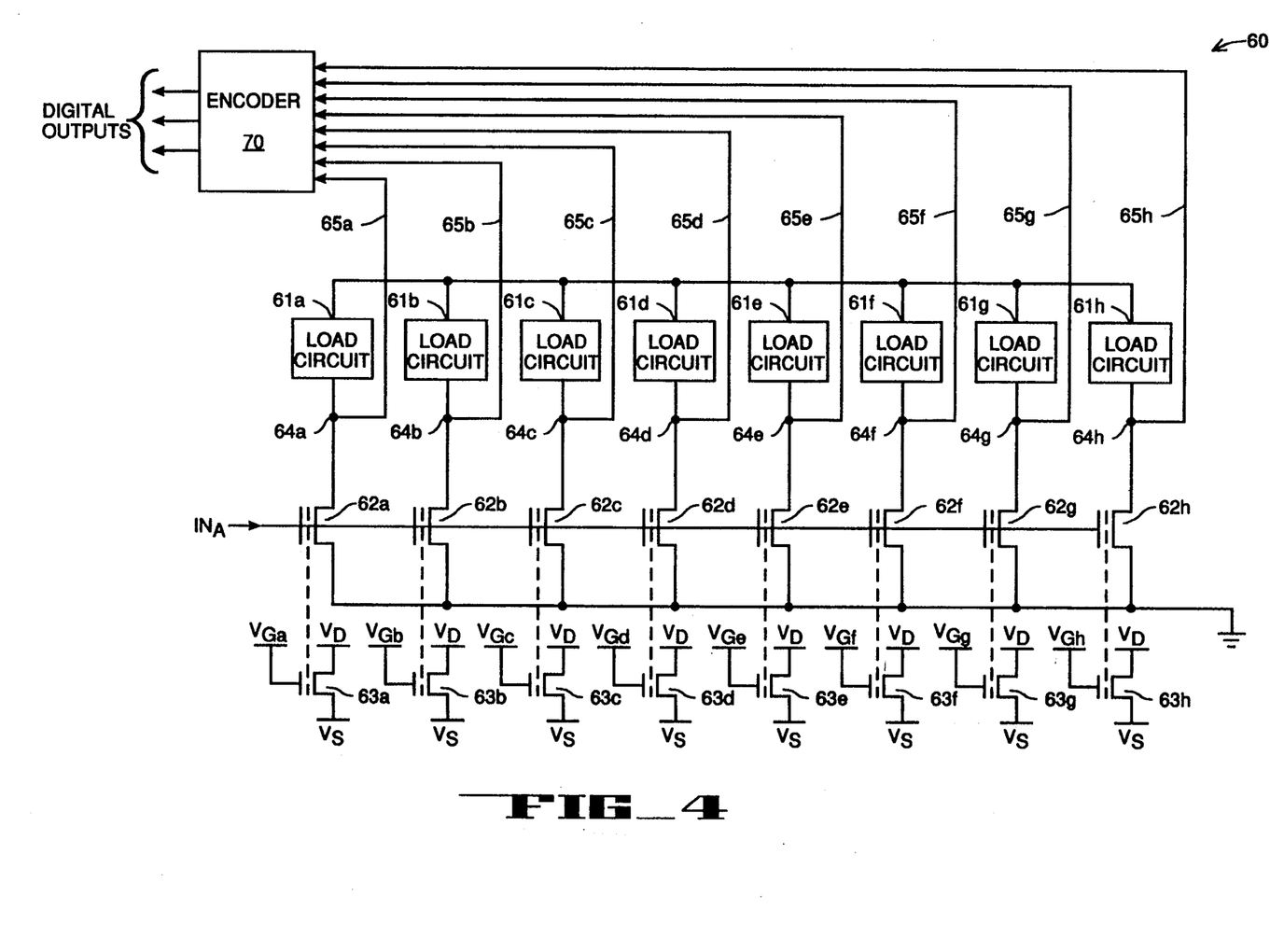
FIG. 4 is a circuitry diagram of an analog-to-digital converter that includes a plurality of electrically erasable and electrically programmable floating gate transistors.

FIG. 4 illustrates in circuitry diagram form an A/D converter 60 that implements an embodiment of the present invention. In FIG. 4, A/D converter 60 is an eight conversion level (i.e., 3 bit) A/D converter. For alternative embodiments, A/D converter 60 can have more or fewer than eight conversion levels. For example, A/D converter 60 can have four or sixteen conversion levels.

A/D converter 60 includes eight electrically erasable and electrically programmable floating gate transistors 62a through 62h, each for one of the eight conversion levels. For this embodiment, each of floating gate transistors 62a–62h corresponds to one of the eight conversion levels. When A/D converter 60 has four conversion levels, A/D converter 60 includes four floating gate transistors.

For an alternative embodiment, each of transistors 62a–62h is an electrically programmable floating gate transistor.

The source of each of floating gate transistors 62a–62h is connected to ground. The control gate of each of transistors 62a–62h is coupled to an analog voltage input $IN_A$. The drain of each of transistors 62a–62h is connected to the $V_{DD}$ voltage via one of load circuits 61a through 61h, respectively. An encoder 70 is connected to the drain of each of transistors 62a–62h at output nodes 64a through 64h via lines 65a through 65h, respectively. Encoder 70 is an eight-to-three encoder.

For one embodiment, each of load circuits 61a–61h includes a resister. For another embodiment, each of load circuits 61a–61h includes a constant-on load transistor.

Like floating gate transistors 33a–33h of FIG. 3, each of floating gate transistors 62a–62h has a programmable threshold voltage. The threshold voltage of each of transistors 62a–62h can be electrically programmed to various voltages and can be electrically erased. The programmable threshold voltage of each of floating gate transistors 62a–62h corresponds to one digital value of an output digital signal to which the input analog voltage $IN_A$ is converted. The threshold voltage of each of transistors 62a–62h differs from that of its adjacent one of transistors 62a–62h by an amount corresponding to the least significant binary bit. For example, when floating gate transistor 62a has a programmable threshold voltage that represents the output digital signal "000," the threshold voltage of transistor 62b then represents the output digital signal "001." For an n-bit binary digital output, $2^n$ floating gate transistors are required.

During operation, the input analog voltage $IN_A$ is applied to the control gate of each of transistors 62a–62h. Depending on the voltage level of the analog voltage $IN_A$, one or more than one of transistors 62a–62h can be conducting. The conducting ones of transistors 62a–62h each then causes the voltage at its output node to be pulled down to ground. For example, when the voltage level of the input analog voltage $IN_A$ is greater than or equal to the threshold voltage of transistor 62c, transistors 62a–62c are caused to conduct and transistors 62d–62h are not conducting. This causes output nodes 62a–62c to be pulled down to ground by their respective conducting transistors 62a–62c while output nodes 62d–62h remain pulled up. As a result, encoder 70 receives a logical zero signal from each of lines 65a–65c and a logical one signal from each of lines 65d–65h.

Encoder 70 encodes the logical signals received from lines 65a–65h into an output binary digital signal. For example, when encoder 70 receives logical zero from lines 65a–65c and logical one from lines 65d–65h, encoder 70 generates a "011" digital output. When encoder 70 receives logical zero from lines 65a–65d, encoder 70 generates a "100" digital output.

A/D converter 60 also includes eight electrically erasable and electrically programmable floating gate transistors 63a through 63h, each for programming and erasing one of transistors 62a–62h. Each of floating gate transistors 63a–63h has its floating gate connected to the floating gate of its associated one of transistors 62a–62h. For example, the floating gate of transistor 63a is connected to that of transistor 62a and the floating gates of transistors 62h and 63h are connected together. Like transistors 33a–33h and 34a–34h of FIG. 3, the threshold of each of transistors 62a–62h of FIG. 4 can be programmed and erased by programming and erasing its associated one of transistors 63a–63h.

For example, when floating gate transistor 62a is required to be programmed to a $V_{TT1}$ threshold voltage, the drain voltage $V_D$ of transistor 63a receives the programming drain voltage pulses of approximately 7 volts and the source of transistor 63a is grounded. The control gate of transistor 63a receives programming control gate voltage pulses of $V_{Ga}$ voltage. The voltage level of the $V_{Ga}$ voltage for transistor 63a is set such that transistor 62a can be programmed to have the $V_{TT1}$ threshold voltage.

The threshold voltage of each of transistors 62a–62h can also be electrically erased by erasing the associated one of transistors 63a–63h. This is done by applying erasure voltage pulses of approximately 12 volts to the source of that transistor. For example, when the threshold voltage of transistor 62a needs to be erased, the erasure voltage pulses are applied to the source of transistor 63a which cause transistor 62a to be erased.

Figure 5:
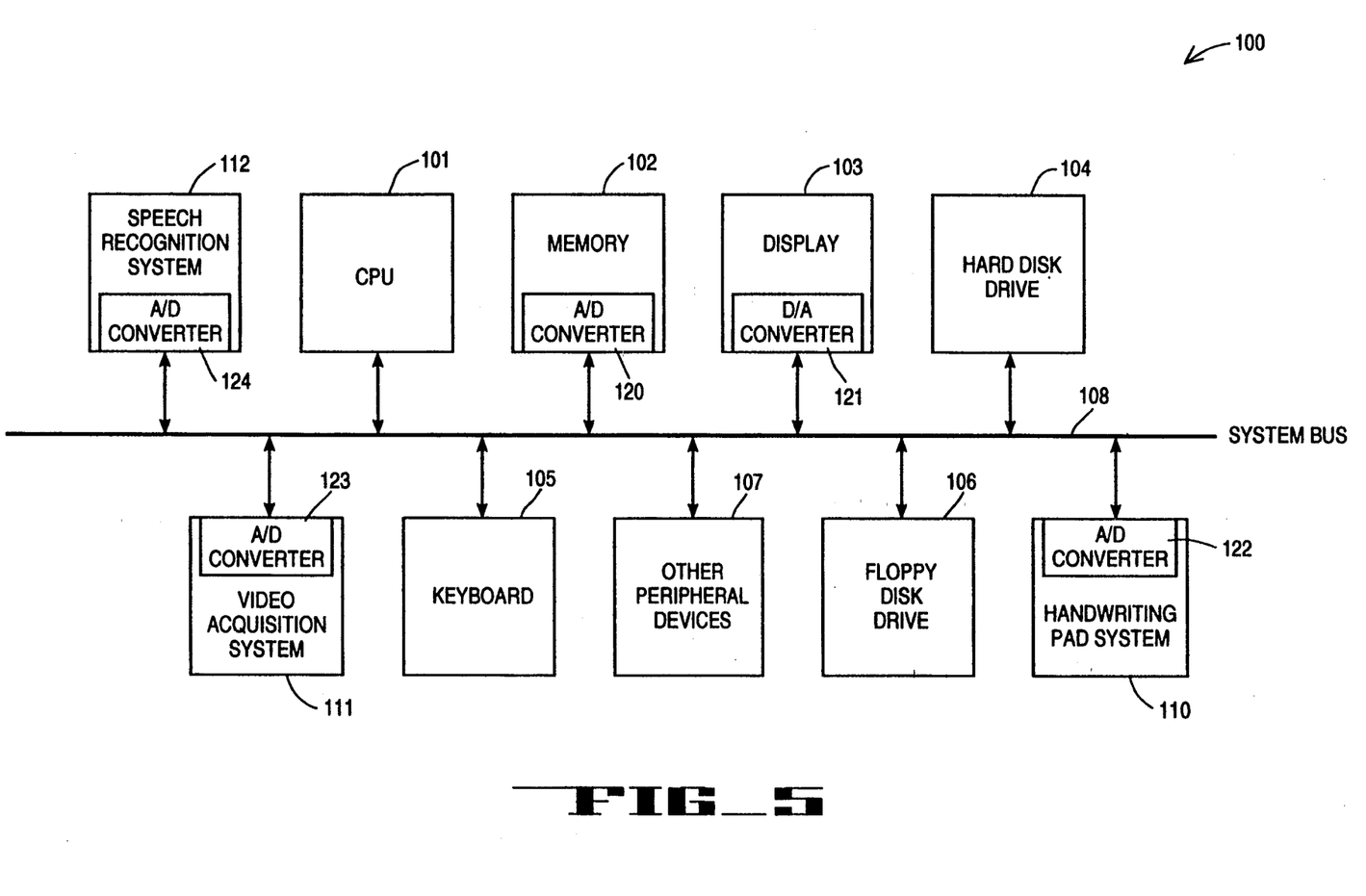
FIG. 5 is a block diagram of a computer system that includes the digital-to-analog converter of FIG. 3 and the analog-to-digital converter of FIG. 4.

FIG. 5 schematically illustrates the architecture of a computer system 100 that includes D/A converter 30 of FIG. 3 and A/D converter 60 of FIG. 4.

Referring to FIG. 5, computer system 100 for one embodiment is a personal computer system. For alternative embodiments, computer system 100 comprises a portable computer, a workstation, a minicomputer, a mainframe, or any other type of computer.

Computer system 9 includes a central processing unit ("CPU") 101. For one embodiment, CPU 101 comprises an i486 ™ microprocessor sold by Intel Corporation of Santa Clara, Calif.

CPU 101 is coupled to a system bus 108 of computer system 100. System bus 108 is used in computer system 100 as the backplane bus for transfer of data among various components of computer system 100.

Computer system 100 includes memory 102. Memory 102 is coupled to system bus 108. Memory 102 stores programs and data of computer system 100.

Memory 102 includes multibit cell memories. In the multibit cell memories, each memory cell stores multiple bit information in analog form. An A/D converter 120 is provided in memory 102 to convert the multibit information read from each cell into digital form. A/D converter 120 can be A/D converter 60 of FIG. 4.

Computer system 100 also includes a floppy disk drive 106, a keyboard 105, a display 103, and a hard disk drive 104 coupled to system bus 108. Display 103 is used to illustrate data of computer system 100. Display 103 includes a D/A converter 121 to convert digital data to be displayed into analog signals that are suitable for display on display 103. D/A converter 121 can be D/A converter 30 of FIG. 3.

Computer system 100 also includes a handwriting pad system 110, a video acquisition system 111, and a speech recognition system 112. Each of systems 110 through 112 includes one of A/D converters 122 through 124, respectively. Each of A/D converters 122 through 124 can be A/D converter 30 of FIG. 3.

Computer system 100 also includes other peripheral devices 107 that are connected to system bus 108. These other peripheral devices may include a mode, a serial communication controller, a local area network ("LAN"), a parallel communication controller.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A digital-to-analog converter, comprising:
    (A) a first electrically programmable floating gate transistor having a drain, a source, a control gate, and a floating gate, wherein the first transistor is electrically programmed by a programming and erasure circuit to have a first electrically programmable threshold voltage;
    (B) a second electrically programmable floating gate transistor having a drain, a source, a control gate, and a floating gate, wherein the second transistor is electrically programmed by the programming and erasure circuit to have a second electrically programmable threshold voltage, wherein the first programmable threshold voltage has a voltage level that is different from that of the second programmable threshold voltage, wherein the control gate of the first and second transistors is coupled to an output node, wherein the output node is coupled to a first voltage source via load circuitry, wherein the source of the first and second transistors is coupled to a second voltage source;
    (C) circuitry coupled to receive a digital input signal for selectively coupling the drain of one of the first and second transistors to the output node in response to the digital signal, wherein (1) when the drain of the first transistor is coupled to the output node, the output node is set at the first programmable threshold voltage, and (2) when the drain of the second transistor is coupled to the output node, the output node is set at the second programmable threshold voltage such that the digital input signal is converted into an analog voltage.

2. The digital-to-analog converter of claim 1, wherein the circuitry further comprises
    (i) first switching circuitry for coupling the drain of the first transistor to the output node in response to a first control signal;
    (ii) second switching circuitry for coupling the drain of the second transistor to the output node in response to a second control signal;
    (iii) input circuitry coupled to receive the digital input signal for decoding the digital input signal to generate one of the first and second control signals at a time, wherein the input circuitry couples the first control signal to the first switching circuitry and the second control signal to the second switching circuitry.

3. The digital-to-analog converter of claim 2, further comprising a plurality of electrically programmable floating gate transistors, including the first and second transistors, and a plurality of switching circuitry, including the first and second switching circuitry, each being coupled to the drain of one of the plurality of electrically programmable floating gate transistors, wherein each of the plurality of electrically programmable floating gate transistors has a programmable threshold voltage.

4. The digital-to-analog converter of claim 3, wherein the input circuitry generates a plurality of control signals, each for one of the plurality of switching circuitry, wherein the input circuitry causes only one of the plurality of switching circuitry to couple the drain of the respective one of the plurality of electrically programmable floating gate transistors to the output node at a time.

5. The digital-to-analog converter of claim 2, wherein the input circuitry further comprises a decoder.

6. The digital-to-analog converter of claim 1, wherein the programming and erasure circuit can also erase the first and second electrically programmable threshold voltages of the respective first and second transistors.

7. An analog-to-digital converter, comprising:
    (A) a first electrically programmable floating gate transistor having a drain, a source, a control gate, and a floating gate, wherein the first transistor is electrically programmed by a programming and erasure circuit to have a first electrically programmable threshold voltage, wherein the drain of the first transistor is coupled to a first output node, wherein the first output node is coupled to a first voltage source via first load circuitry;
    (B) a second electrically programmable floating gate transistor having a drain, a source, a control gate, and a floating gate, wherein the second transistor is electrically programmed by the programming and erasure circuit to have a second electrically programmable threshold voltage, wherein the drain of the second transistor is coupled to a second output node, wherein the first programmable threshold voltage has a voltage level that is different from that of the second programmable threshold voltage, wherein the second output node is coupled to the first voltage source via second load circuitry, wherein the source of the first and second transistors is coupled to a second voltage source, wherein the control gate of the first and second transistors is coupled to receive an input analog voltage, wherein when the input analog voltage is greater than or equal to the first programmable threshold voltage, the first transistor is conducting and the first output node generates a first signal, wherein when the input analog voltage is greater than or equal to the second programmable threshold voltage, the second transistor is conducting and the second output node generates a second signal;

(C) output circuitry coupled to the first and second output nodes for encoding the first and second signals into a digital output signal such that the input analog voltage is converted into the digital output signal.

8. The analog-to-digital converter of claim 7, wherein the digital output signal has a first digital value when the first output node generates the first signal, wherein the digital output signal has a second digital value when the second output node generates the second signal.

9. The analog-to-digital converter of claim 7, wherein the programming and erasure circuit can also erase the first and second electrically programmable threshold voltages of the respective first and second transistors.

10. The analog-to-digital converter of claim 7, further comprising a plurality of electrically programmable floating gate transistors, including the first and second transistors, each having a floating gate, a control gate coupled to the input analog voltage, a source coupled to the second voltage source, a drain coupled to one of a plurality of output nodes, wherein each of the plurality of output nodes is coupled to the first voltage via one of a plurality of load circuitry, wherein each of the plurality of electrically programmable floating gate transistors has a programmable threshold voltage.

11. The analog-to-digital converter of claim 10, wherein each of the plurality of output nodes generates a signal to the output circuitry when its respective one of the plurality of electrically programmable floating gate transistors is caused to be conducting, wherein the output circuitry generates the digital output signal in accordance with one of the plurality of electrically programmable floating gate transistors that has a highest threshold voltage among a number of the plurality of electrically programmable floating gate transistors that are conducting.

12. The analog-to-digital converter of claim 7, wherein the output circuitry further comprises a decoder.

* * * * *

UNITED STATES PATENT AND TRADEMARK OFFICE
CERTIFICATE OF CORRECTION

| | | |
|---|---|---|
| PATENT NO. | : 5,376,935 | Page 1 of 2 |
| DATED | : December 27, 1994 | |
| INVENTOR(S) | : Daniel A. Seligson | |

It is certified that error appears in the above-identified patent and that said Letters Patent is hereby corrected as shown below:

In column 3 at line 18 delete "convened" and insert --converted--

In column 3 at line 29 delete "FIG. 1" and insert --Figures 1A and 1B illustrate--

In column 3 at line 30 insert --and the symbolic representation of the floating gate transistor-- prior to ";" and following "transistor"

In column 3 at line 59 delete "FIG. 1" and insert --Figure 1A--

In column 3 at line 62 delete "FIG. 1" and insert --Figure 1B--

In column 4 at line 17 delete "FIG. 1" and insert --Figures 1A and 1B--

UNITED STATES PATENT AND TRADEMARK OFFICE
CERTIFICATE OF CORRECTION

PATENT NO. : 5,376,935
DATED : December 27, 1994
INVENTOR(S) : Daniel A. Seligson It is certified that error appears in the above-indentified patent and that said Letters Patent is hereby corrected as shown below:

In column 4 at line 40 delete "FIG. 1" and insert --Figures 1A and 1B--

Signed and Sealed this

First Day of July, 1997

Attest:

BRUCE LEHMAN

*Attesting Officer*    Commissioner of Patents and Trademarks